(12) United States Patent
Li et al.

(10) Patent No.: US 6,798,003 B2
(45) Date of Patent: Sep. 28, 2004

(54) RELIABLE ADHESION LAYER INTERFACE STRUCTURE FOR POLYMER MEMORY ELECTRODE AND METHOD OF MAKING SAME

(75) Inventors: Jian Li, Sunnyvale, CA (US); Xiao-Chun Mu, Saratogo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/909,375

(22) Filed: Jul. 20, 2001

(65) Prior Publication Data

US 2003/0017623 A1 Jan. 23, 2003

(51) Int. Cl.[7] .............................................. H01L 47/00
(52) U.S. Cl. ........................... 257/295; 438/3; 438/6; 438/253; 438/396; 438/939
(58) Field of Search ......................... 257/295; 438/3, 438/6, 152, 253, 256, 393, 396, 939; 437/32, 34, 67, 192, 200

(56) References Cited

U.S. PATENT DOCUMENTS

| | | | | |
|---|---|---|---|---|
| 5,592,643 A | * | 1/1997 | Thomas | 395/431 |
| 6,210,979 B1 | * | 4/2001 | Kweon et al. | 438/3 |
| 6,337,032 B1 | * | 1/2002 | Chivukula et al. | 252/62.9 R |
| 6,420,190 B1 | * | 7/2002 | Shimoda et al. | 438/3 |

FOREIGN PATENT DOCUMENTS

JP        363293729 A  * 11/1988 ................. 526/255

OTHER PUBLICATIONS

IBM technical Disclosure Bulletin, vol. 37 (11), p. 421–424 (1994).*
Borca, C., et al., "Influence of dynamical scattering in crystalline poly (vinylidene fluoride–trifluoroethylene) copolymers", *Applied Physics Letters, vol. 74*, 347–349, (Jan. 18, 1999).
Borca, C., et al., "Lattice–Stiffening Transition in Copolymer Films of Vinylidene Fluoride (70%) with Trifluoroethylene (30%)", *Physical Review Letters*, 4562–4565, (Nov. 29, 1999).

(List continued on next page.)

*Primary Examiner*—Kamand Cuneo
*Assistant Examiner*—Asok Kumar Sarkar
(74) *Attorney, Agent, or Firm*—Tony M. Martinez

(57) ABSTRACT

A polymer memory device includes two organic adhesion layers that facilitate an integral package comprising a lower and an upper electrode and the ferroelectric polymer memory structure. The ferroelectric polymer memory structure includes crystalline ferroelectric polymer layers such as single and co-polymer compositions. The structure includes spin-on and/or Langmuir-Blodgett deposited compositions.

A memory system allows the polymer memory device to interface with various existing hosts.

22 Claims, 4 Drawing Sheets

OTHER PUBLICATIONS

Bune, A., et al., "Piezoelectric and pyroelectric properties of ferroelectric Langmuir–Blodgett polymer films", *Journal of Applied Physics, vol. 85*, 7869–7873, (Jun. 1, 1999).

Bune, A., et al., "Two–dimensional ferroelectric films", *Nature, vol. 391*, 874–877, (Feb. 26, 1998).

Choi, J., et al., "Phase transition in the surface structure in copolymer films of vinylidene fluoride (70%) with trifluoroethylene (30%)", *Physical Review B, vol. 61*, 5760–5770, (Feb. 15, 2000).

Desu, S., "Minimization of Fatigue in Ferroelectric Films", *Phys. Stat. Sol. (a) 151*, 467–480, (1995).

Ducharme, S., et al., "Ultrathin Ferroelectric Polymer Films", *Ferroelectrics, vol. 202*, 29–37, (1997).

Lovinger, A.J., "Ferroelectric Polymers", *Science, vol. 220*, 1115–1121, (Jun. 10, 1983).

Morikawa, E., et al., "Photoemission study of direct photomicromachining in poly(vinylidene fluoride)", *Journal of Applied Physics, vol. 87*, 4010–4016, (Apr. 15, 2000).

* cited by examiner

RELIABLE ADHESION LAYER INTERFACE STRUCTURE FOR POLYMER MEMORY ELECTRODE AND METHOD OF MAKING SAME

BACKGROUND OF THE INVENTION

1. Field of the Invention

The present invention relates to fabrication of a microelectronic storage device. More particularly, the present invention relates to a cross-point ferroelectric polymer memory device. In particular, the present invention relates to improved adhesion of electrodes to a ferroelectric polymer memory structure. Additionally, the present invention relates to improved containment of volatile fluorine-based materials.

2. Description of Related Art

In the microelectronics field, continual pressure exists to find faster, denser, and more cost-effective solutions to data storage. Whether the data storage is fast, on-die storage such as static random access memory (SRAM), whether it is the somewhat slower embedded dynamic random access memory (eDRAM), the even slower off-die dynamic random access memory (DRAM), or whether it is magnetic- or magneto optical disks for mass storage, each technology is constantly being advanced to meet the demand for increased speed and capacity.

It was discovered that some polymers exhibit ferromagnetism. One such polymer is poly vinylidene fluoride (PVDF, whose repeat formula is $(CH_2-CF_2)_n$) and some of its copolymers. One activity involved in fabrication of a ferroelectric polymer data storage device relates to getting proper adhesion of the polymer memory structure to the electrodes that are used to address, read, and write to the polymer memory structure. Another activity relates to preventing undesirable volatilization of fluorine in the polymer memory structure during fabrication, test, and field use. The stability of the polymer and its electrode upon read and write cycles determines the reliability of the polymer memory device.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

Figure 1:
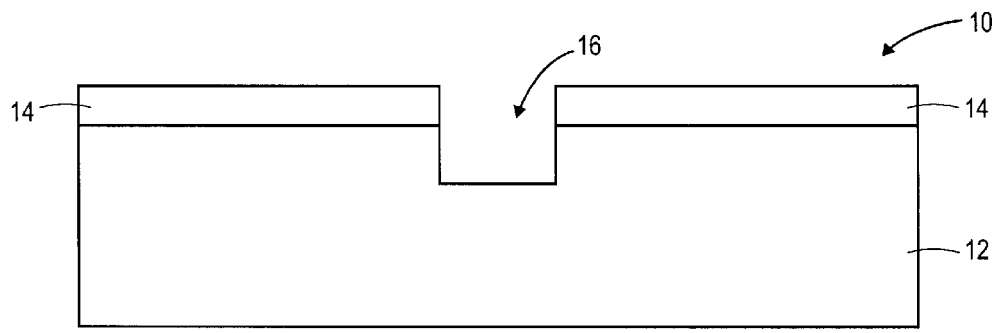
FIG. 1 is an elevational cross-section of a semiconductor structure that illustrates one stage of fabrication of an embodiment of the present invention.

The present invention relates to a ferroelectric polymer storage device including a ferroelectric polymer structure that is sandwiched between two arrays of electrodes that achieve electrical signaling across the ferroelectric polymer structure.

The ferroelectric polymer storage device may be referred to as a cross-point matrix polymer memory structure. Because of the demands of getting sufficient adhesion between the ferroelectric polymer material and the electrodes that are used to read and write to the polymer memory structure, and because of the volatilization of fluorine (F) from the polymer film during fabrication, test, and field use, the present invention addresses appropriate solutions for the ferroelectric polymer memory devices.

In the present invention, a ferroelectric polymer structure is formed on a substrate prior to additional processes. If adhesion of the ferroelectric polymer structure to the substrate or electrodes is weak, the device may not remain integral during fabrication, test, and field use. As a result, lift-off may occur that results in an inferior quality memory device. Thus, it is important to improve adhesion of the ferroelectric polymer structure during fabrication. Additionally, fluorine may volatilize and migrate into structures that may result in a yield loss or a field failure.

Since the ferroelectric polymer device is hydrophobic and the surface of its substrate is usually hydrophilic, the affinity between the ferroelectric polymer structure and the substrate surface may be problematic. Thus, for the purpose of improving the affinity, an adhesion-promoter layer treatment process is utilized wherein an affinity-improving agent is sprayed on the substrate surface in a vapor state, or is spun on the substrate surface in the liquid state.

Generally, in order to improve the adhesion between the ferroelectric polymer structure and the substrate surface, a process of depositing an adhesion promoter on the substrate surface is performed using an adhesion promoter-supplying apparatus before depositing the ferroelectric polymer structure.

The cross-point matrix ferroelectric polymer memory device may comprise a first electrode disposed on the substrate. A protective film may be disposed upon the first electrode. A first thin adhesion promoter layer is disposed over the substrate before formation of the ferroelectric polymer structure. The thin adhesion promoter layer may be referred to as an organic adhesion layer. A ferroelectric polymer structure is disposed over the thin adhesion promoter layer and the substrate. A second thin adhesion promoter layer is disposed over the ferroelectric polymer structure. A second protective film may be patterned in a cross-layout configuration to the first protective film, if it is present. In any event, a second electrode is disposed in a cross-layout configuration to the first electrode and the first protective film, if the first protective film is present.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 2:
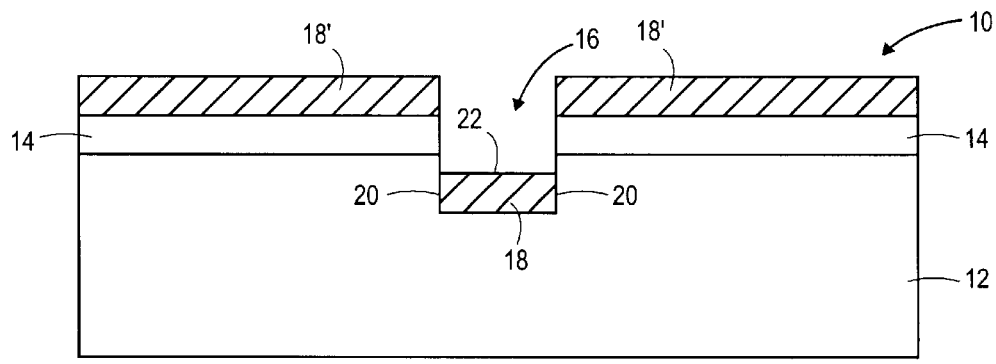
FIG. 2 is an elevational cross-section of the semiconductor structure depicted in FIG. 1 after further processing.

FIG. 1 is an elevational cross-section illustration of a memory structure 10 during fabrication of a ferroelectric polymer (FEP) memory device according to one embodiment. A substrate 12 is patterned with a mask 14 and a recess 16 has been formed in substrate 12 through mask 14. Recess 16 is prepared to accept a first or lower electrode 18 as depicted in FIG. 2. FIG. 2 also illustrates extraneous electrode material 18' above and on mask 14, both of which will be removed.

First electrode 18 may be formed by depositing metals by chemical vapor deposition (CVD) followed by planarizing of any material that is suitable as an electrical conductor according to electrical conductors known in the art such as an Al/Ti bilayaer. In one embodiment, first electrode 18 is an aluminum material. In one embodiment, first electrode 18 is a copper or copper alloy material. The thickness of the first electrode 18 may depend upon the specific lithography and design rules.

In one embodiment, a self-aligned structure may be formed by initially depositing first electrode 18 by physical vapor deposition (PVD) as depicted in FIG. 2. First electrode 18 may be made of any material that is suitable as an electrical conductor according to what is known in the art. First electrode 18, when formed by PVD, may be carried out in a collimated fashion to achieve little or no contact with the sidewalls 20 above an upper surface 22 of first electrode 18 in recess 16. A collimated PVD resists contact of electrode material with sidewalls 20 above upper surface 22 of what is deposited if the aspect ratio of the collimator is set to match or exceed the aspect ratio of recess 16. Mask 14 may remain in place for both patterning of recess 16 and for forming first electrode 18 on substrate 12 for this embodiment. After PVD of first electrode 18, mask 14 may be removed according to known techniques such as wet stripping or such as ashing the mask and rinsing the substrate. Accordingly, extraneous electrode material 18' depicted upon mask 14 in FIG. 2 is removed with the mask removal technique.

Figure 3:
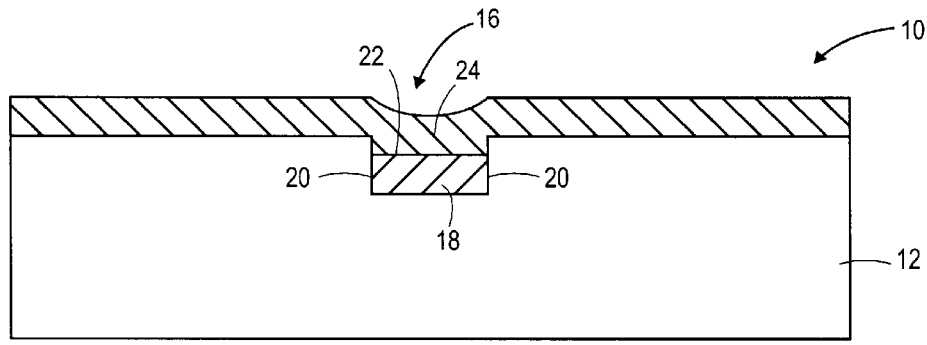
FIG. 3 is an elevational cross-section of the semiconductor structure depicted in FIG. 2 after further processing.

FIG. 3 illustrates the memory structure 10 after further processing to form a self-aligned electrode structure. A protective layer 24 is formed over substrate 12 and first electrode 18. Protective layer 24 may be formed by CVD in order to achieve contact at sidewalls 20 of recess 16. CVD conditions are known in the art, and are often dictated by the specific application, the materials to be deposited, and the thermal budget of the article being manufactured. In one embodiment, atomic layer chemical vapor deposition (ALCVD), according to known technique, is used to form protective layer 24.

Protective layer 24 may be a metal, a refractory metal, or a metal or refractory metal alloy. Additionally, protective layer 24 may be a nitride, oxide, or carbide of the metal, refractory metal, or alloy thereof. Further combinations of the above may be selected, such as a composite protective layer. One embodiment of protective layer 24 includes a titanium nitride (TiN) layer. Another embodiment includes a titanium oxide (TiO$_2$) layer. Further details of protective layer 24, as to materials embodiments, are set forth herein. The low damage TiN film may be used as a diffusion barrier for copper-based interconnects.

Figure 4:
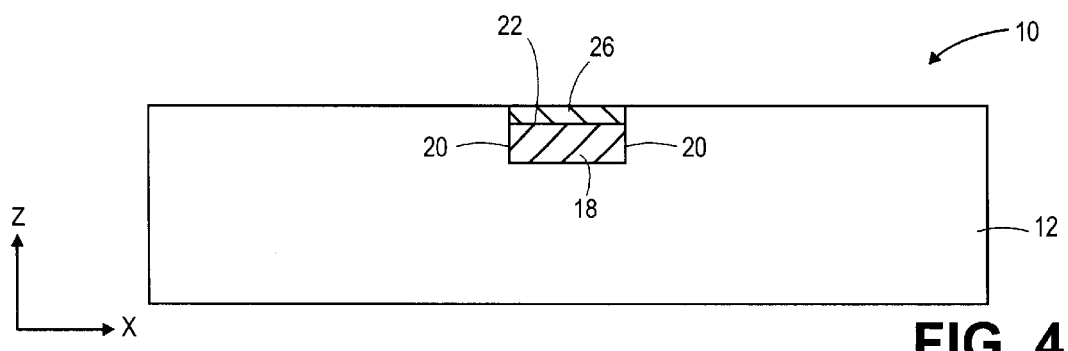
FIG. 4 is an elevational cross-section of the semiconductor structure depicted in FIG. 3 after further processing.

FIG. 4 illustrates the memory structure 10 after further processing. Protective layer 24 (see FIG. 3) has been reduced in vertical profile to leave a first or lower protective film 26 over first electrode 18. Reduction of the vertical profile may be carried out by mechanical polishing, chemical-mechanical polishing (CMP), chemical etchback, and the like. In one embodiment, CMP is employed with a chemical recipe that is selective to substrate 12, although some reduction of the vertical profile in the Z-direction may be permitted. Accordingly, a damascene structure is formed of substrate 12, first electrode 18, and first protective film 26. Where first protective film 26 is not employed, a CVD formation of first electrode 18 may be followed by vertical profile reduction as set forth herein that stops near or on upper surface 22 of first electrode 18.

First protective film 26 may be made of a material selected from metals, refractory metals, their alloys, their nitrides, oxides, carbides, and combinations thereof. In one embodiment, first protective film 26 may be a metal such as aluminum. In another embodiment, first protective film 26 may be a refractory metal such as titanium, a refractory metal nitride such as titanium nitride (TiN), or a refractory metal oxide such as titania (TiO$_2$), as either rutile or anatase phase. Other refractory metals may include titanium, zirconium, hafnium, and the like. Other refractory metals may include nickel, cobalt, palladium, platinum, and the like. Other refractory metals may include chromium, molybdenum, tungsten, and the like. Other refractory metals may include scandium, yttrium, lanthanum, cerium, and the like.

By way of non-limiting example, first protective film 26 may be formed by ALCVD of TiN or TiO$_2$. First protective film 26 may be in a thickness range from about 10 nanometers (nm) to about 100 nm, preferably from about 20 nm to about 50 nm.

Figure 5:
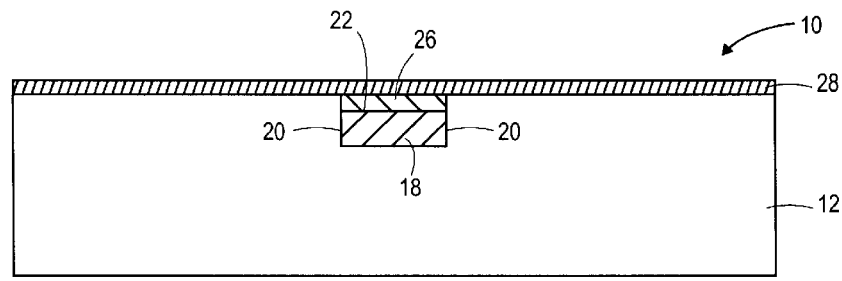
FIG. 5 is an elevational cross-section depicted in FIG. 4 after further processing.

With the optional formation of first protective film 26, memory structure 10 is prepared to receive a first thin adhesion promoter layer over the substrate 12. FIG. 5 illustrates further processing in which a first thin adhesion promoter (TAP) layer 28 is formed over substrate 12, and first protective film 26 if present.

First TAP layer 28 adheres both to a given substrate and a given ferroelectric polymer structure. First TAP layer 28 may preferably have the property of adhering to inorganic structures such as substrate 12, if it is by way of non-limiting example, an interlayer dielectric composition such as a silicon oxide or the like. In any event, first TAP layer 28 also will adhere to a ferroelectric polymer structure. The TAP layer 28 composition may be spun on over substrate 12. A spin-on process may be carried out by depositing the adhesion promoter as a fluid in a puddle prime onto substrate 12 for a period of from about 5 to 25 seconds and spinning substrate 12 and in a rotational range from about 300 revolutions per minute (rpm) to about 6000 rpm and for a time range from about 5 seconds to about 20 seconds. Alternatively, first TAP layer 28 may be formed by chemical vapor deposition (CVD) of an adhesion promoter composition in a carrier gas. Such CVD conditions are known in the art and are temperature restrictive for certain organic adhesion layer materials.

One class of adhesion promoters includes silicon-functional groups such as hexamethyldisilazane (HMDZ). Other classes of adhesion promoters may be selected according to what is known in the art. For example, where substrate 12 is an FR board, a different adhesion promoter may be selected compared to where substrate 12 is a hydrophilic inorganic such as the silicon oxide or the like of an interlayer dielectric material.

First TAP layer 28 also acts to resist the formation fugitive vapors such as fluorine-containing gas that may volatilize during fabrication and field use. Fugitive vapors such as fluorine may cause damage to FEP memory structures.

The amount of TAP material that is formed on substrate 12 may depend upon the particular application as well as the design rules that are linked with a specific lithography technology. For example, the thickness of first TAP layer 28 may be in a range from about 25 Å to about 200 Å, preferably from about 50 Å to about 100 Å. This thickness range may be achieved by spin-on technology as set forth herein.

Figure 6:
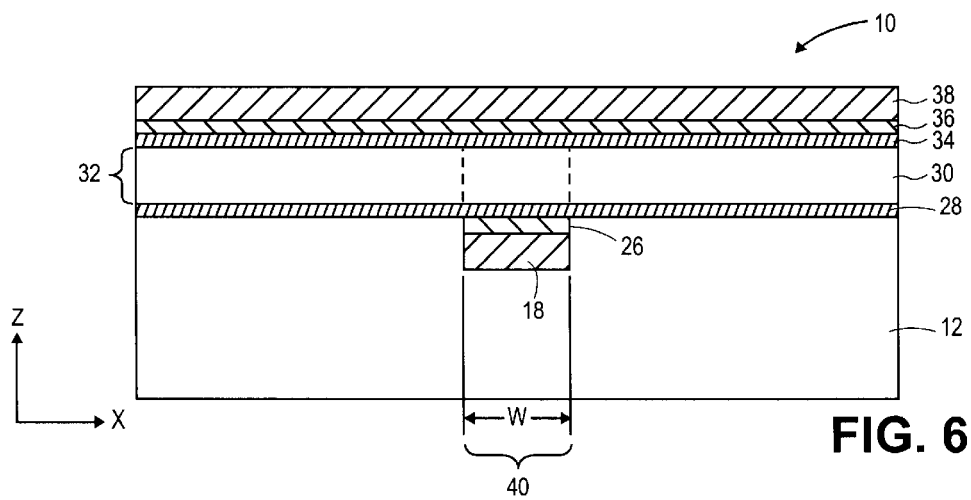
FIG. 6 is an elevational cross-section of a cross-point polymer memory cell that is the semiconductor structure depicted in FIG. 5 after further processing.

FIG. 6 illustrates an embodiment of the present invention after further processing of the memory structure 10 depicted in FIG. 5. In one embodiment, a ferroelectric polymer (FEP) layer 30 is formed by the Langmuir-Blodgett deposition technique as is known in the art. It usually comprises an ambient temperature process of dipping a substrate into a vessel containing fluid material that will precipitate onto the substrate during dipping.

An FEP structure 32 that is a single crystalline layer is therefore formed out of FEP layer 30. In one example, the formation of a monolayer of P(VDF-TrFE) copolymer may have a vertical profile of about 5 Å. A preferred thickness of FEP layer 30 that comprises a single, crystalline layer may be in a range from about 100 Å to about 2,000 Å or larger, subject only to the design rules of a specific application. Other thicknesses for FEP layer 30 that comprises a single, crystalline layer may be in a range from about 200 Å to about 1,500 Å. Other thicknesses for FEP layer 30 may be in a range from about 300 Å to about 1,000 Å.

By "crystalline" it may be understood that the Langmuir-Blodgett (L-B) deposition technique may form a polymer that is a highly ordered structure according to the Miller-Bravais indices lattice system or the like, wherein substantially a monolayer is formed.

Most polymer systems will exhibit some degree of atacticity, however, the L-B technique has achieved virtually isotactic FEP films. Where an FEP copolymer is formed by the L-B deposition technique, the film will tend more away from isotacticity than for a monomer under similar deposition conditions. In some situations, a syndiotactic film may be formed, even where functional groups in the polymer or copolymer film are bulkier than others. By the same token, a syndiotactic copolymer is achievable under the L-B deposition technique, but the copolymer will also tend toward atacticity, depending upon whether the copolymer film forms as a random, regular, block, or graft copolymer.

The crystalline structure may begin to deviate from a highly ordered (isotactic or syndiotactic) lattice configuration where several monolayers of an FEP structure are formed by the L-B technique. In one embodiment, a five-monolayer structure is formed. In another embodiment, a ten-monolayer structure is formed. Accordingly, instead of a highly ordered monocrystalline lattice structure, lamellae of monolayers or monolayer groups may form with some dislocations at the lamellar interfaces. The crystalline nature of a five- or ten-monolayer structure may be compared to a hypothetical highly ordered five- or ten-monolayer structure, in a range from about 20% crystalline to about 80% crystalline. In one embodiment, the ordered amount of crystallinity (degree of isotacticity) in FEP layer 30 is in a range from about one-third to about two-thirds, preferably greater that about one-half of the lamellar structure up to and including about 95% crystalline. The ordered amount of the crystalline structure may be quantified by diagnostic techniques such as scanning electron microscopy, x-ray diffraction, and others. Under tightly controlled operating conditions, crystallinity may be as high as about 95% for 5- and 10-monolayer structures, and structures between these monolayer numbers.

In another embodiment, FEP 30 layer may also be a solitary FEP structure 32 that is formed by a spin-on process. Accordingly, similar to what is depicted in FIG. 6 as an FEP structure 32 that is crystalline, FEP structure 32 may exhibit less crystalline behavior that a structure formed by the L-B technique. It may be noted that the degree of crystallinity of FEP structure 32 that is formed by a spin-on process may be lower than the degree of crystallinity of an embodiment of FEP structure 32 when it is formed by L-B deposition.

The FEP structure 32 that is formed by a spin-on process may be likewise made of any of the polymers, copolymers, combinations, and ratios thereof as set forth in this disclosure for L-B formation thereof. The thickness of an FEP structure 32 that is formed by a spin-on process may be in a range from about 500 Å to about 2,000 Å or larger, preferably from about 600 Å to about 1,500 Å, and most preferably from about 700 Å to about 1,000 Å.

Various polymers may be used to form the FEP structures, whether crystalline or spin-on. In one embodiment FEP structure 32 is made from a ferroelectric polymer selected from polyvinyl and polyethylene fluorides, copolymers thereof, and combinations thereof. In another embodiment FEP structure 32 is made from a ferroelectric polymer selected from polyvinyl and polyethylene chlorides, copolymers thereof, and combinations thereof. In another embodiment FEP structure 32 is made from a ferroelectric polymer selected from polyacrylonitriles, copolymers thereof, and combinations thereof. In another embodiment FEP structure 32 is made from a ferroelectric polymer selected from polyamides, copolymers thereof, and combinations thereof. Other embodiments may include combinations of the above that cross different types such as polyfluorides and polyamides or polyfluorides and polyacrylonitriles.

In one embodiment FEP structure 32 is made from a ferroelectric polymer selected from $(CH_2-CF_2)_n$, $(CHF-CF_2)_n$, $(CF_2-CF_2)_n$, α-, β-, γ-, and δ-phases thereof, preferably the β-phase, $(CH_2-CF_2)_n-(CHF-CF_2)_m$ copolymer, α-, β-, γ-, and δ-phases, preferably the β-phase of $(CH_2-CF_2)_n-(CHF-CF_2)_m$ copolymer, and combinations thereof. The copolymer of $(CH_2-CF_2)_n-(CHF-CF_2)_m$ may be referred to as P(VDF-TrFE) or poly vinylidene fluoride-triflouroethylene. In one particular embodiment FEP structure 32 is made from a ferroelectric polymer selected from a β-phase copolymer of $(CH_2-CF_2)_n-(CHF-CF_2)_m$ wherein n and m total to equal 1, and wherein n is in a fraction range from about 0.6 to about 0.9, preferably from about 0.7 to about 0.8, and more preferably about 0.75.

FIG. 6 also illustrates further processing in which a second thin adhesion promoter (TAP) layer 34 is formed over FEP layer 30. Second TAP layer 34 may preferably have the same properties as first TAP layer 28. Preferably, second TAP layer 34 is the same composition as first TAP layer 28. In one processing embodiment, the formation of first tap layer 28, FEP layer 30, and second TAP layer 34 are all accomplished in a single process flow that may provide L-B deposition conditions.

In another embodiment, second TAP layer 34 is spun on over FEP layer 30. A spin-on process may be carried out by depositing the adhesion promoter as a fluid in a puddle prime over FEP structure 32 for a period of from about 5 to 25 seconds and spinning substrate 12 in a rotational range from about 300 rpm to about 6000 rpm and for a time range from about 5 seconds to about 20 seconds.

It is preferred to select an adhesion promoter composition that will facilitate mating of the electrodes to FEP structure 32, either directly or through intermediate layers such as the optional first protective film 26 and substrate 12.

In another embodiment, second TAP layer 34 is formed by L-B deposition, but first TAP layer 28 is formed by spin-on processing. By this embodiment, rotational shear forces are not imposed upon FEP structure 32 spin-on processing is avoided that would otherwise occur by spin-on forming of second TAP layer 34. Hence, the memory article that is formed includes first TAP layer 28 that exhibits a morphology characteristic of a spin-on formation process. Accordingly, second TAP layer 34 exhibits a morphology characteristic of an L-B deposition process.

FIG. 6 also illustrates further processing in which a second or upper protective film 36 and a second or upper electrode 38 are formed in a configuration commonly referred to as a "cross point" 40. In other words, the cross point 40 or projection of the width W, of first electrode 18 upward onto second electrode 38 exposes an area of FEP structure 32 that is about equivalent to the square of width W if second electrode 38 also has a width of about width W. The amount of FEP structure 32 that is within this projected area may be most susceptible of being written to and read from as a memory element embodiment. The cross point 40 of memory structure 10 may have a dimension in the X-direction that may be tied to a particular minimum-feature mask technology. For example, lithography process flows may have minimum features that are 0.25 micrometers (microns), 0.18 microns, and 0.13 microns. Other minimum features that may be accomplished in the future are applicable to the present invention. As set forth herein, the Z-direction thickness of second protective film 36 and second electrode 38, may match those of first protective film 26 and first electrode 18, respectively.

As geometries continue to shrink due to the pressure to further miniaturize, L-B deposition technology may be used to form ever-thinner TAP layers as well as FEP layers. In one embodiment, first TAP layer 28 and second TAP layer 34 are formed by L-B deposition to a thickness in a range from about less than 10 Å to about 100 Å, preferably from about 20 Å to about 50 Å. Accordingly, an FEP layer 30 is also formed by L-B deposition therebetween to a thickness in a range from about 100 Å to about 2,000 Å.

Figure 7:
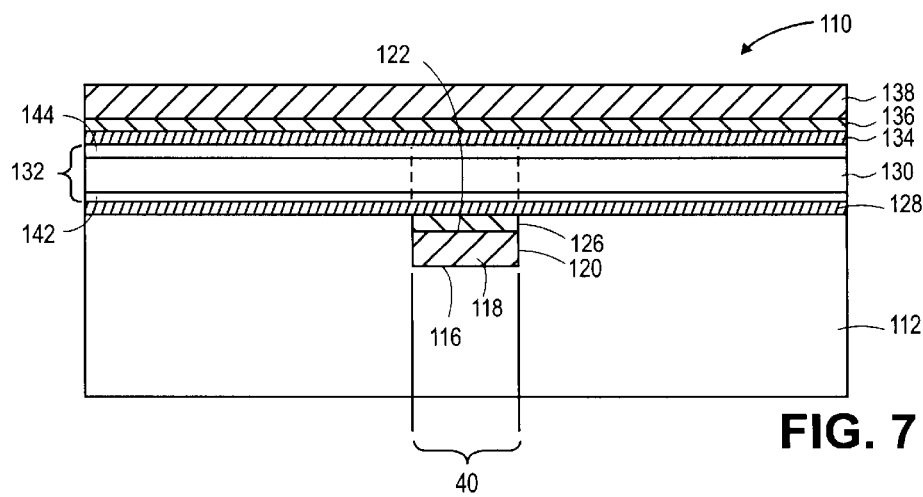
FIG. 7 is an elevational cross-section of a cross-point polymer memory cell that is the semiconductor structure depicted in FIG. 5 after further processing.

FIG. 7 illustrates another embodiment of a memory structure 110. Accordingly, memory structure 110 includes a substrate 112 with a filled recess 116 that has a first electrode 118 that is disposed between sidewalls 120 in recess 116. Optionally, above the upper surface 122 of first electrode 118, a first or lower protective film 126 may be formed as set forth herein. A first TAP layer 128 is formed as set forth herein. Other structures can be seen such as an FEP layer 130 that is part of a larger FEP structure 132. Additionally, a second TAP layer 134 is disposed over FEP structure 132, a second or upper protective film 136 is disposed over second TAP layer 134, and a second or upper electrode 138 is disposed over second protective film 134. Second electrode 138 forms a cross-point 140 intersection with first electrode 118.

Surface engineering of FEP layer 130 may be preferred where the presence of first and second TAP layers 128 and 134, respectively, may not be adequate protection for the sensitive nature of the thin FEP layer 130 during subsequent processing. In other words, where FEP structure 32, depicted in FIG. 6, requires additional isolation from the electrodes in order to prevent damage, surface engineering is carried out by forming at least one of the first or second FEP layers. This process flow to achieve the isolation that is depicted as FEP structure 132 in FIG. 7.

Accordingly, a first or lower crystalline FEP layer 142 is formed by L-B deposition as set forth herein. The thickness of first crystalline FEP layer 142 is in a range from about 5 Å to about 45 Å. Because surface engineering of FEP structure 132 may only be of significance to the polymer material that is exposed to processing after the formation of FEP structure 132, first crystalline FEP layer 142 may be omitted as set forth herein.

Next, an FEP layer 130 is formed either by spin-on- or L-B deposition technology, to a thickness from about 500 Å to about 2,000 Å, preferably about 1,000 Å. FEP layer 130 may comprise a copolymer of $(CH_2-CF_2)_n-(CHF-CF_2)_m$ wherein n and m equal 1, and wherein n is about 0.75.

A second or upper crystalline FEP layer 144 is formed to a thickness from about 5 Å to about 45 Å. Where either first- and second-crystalline FEP layers 142 and 144, respectively, are present, the layers may comprise a copolymer of $(CH_2-CF_2)_n-(CHF-CF_2)_m$ wherein n and m equal 1, and wherein n is about 0.75. Other structures may be present above second electrode 138 that are not depicted in this disclosure for clarity.

The following discussion may be applicable to the structures depicted in both FIGS. 6 and 7. If present, protective films 26, and 36, or 126 and 136 are preferably formed by ALCVD according to known technique. Although a CVD of second electrode 36 or 136 is not preferred due to the physical contact- and temperature-sensitive nature of FEP structure 32 or 132, ALCVD of protective films 26, 36, or 126, 136 may be carried out due to the lower processing temperatures required by ALCVD. After the formation of second protective films 36, 136, second electrodes 38, 138 are formed by PVD under conditions that will not substantially damage FEP structures 32, 132, respectively.

According to embodiments of the present invention, at least two article qualities are accomplished. First, sufficient adhesion is achieved by the presence of the TAP layers to prevent a significant amount of lift-off of electrodes from the FEP structures. Second, both adhesion and low molecular porosity of the TAP layers result in a sealing structure that resists pass-through and emission of fluorides that may volatilize out of the FEP structure during fabrication, test, and field use.

Figure 8:
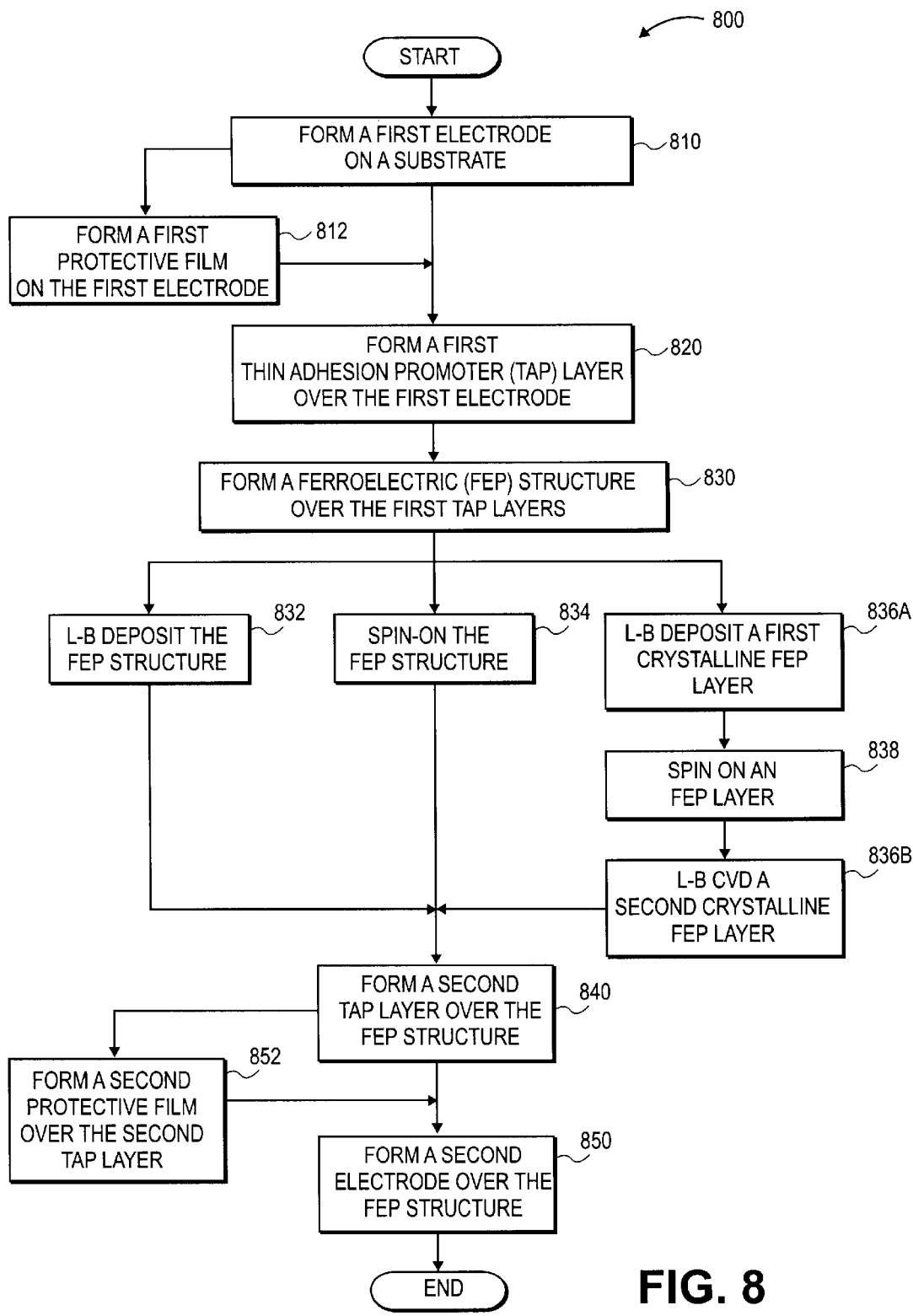
FIG. 8 is a flow chart that describes method embodiments.

FIG. 8 illustrates a process flow embodiment that describes fabrication of a memory cell of an FEP structure and that describes surface engineering of the FEP structure(s). A process 800 includes various process flow alternatives. First the process 800 begins by forming 810 a first electrode on a substrate. The substrate may be silicon with logic and other structures such as embedded memory.

The logic and/or embedded memory may include structures such as n-doped metal oxide silicon (n-MOS), p-doped MOS (p-MOS), complementary MOS (CMOS), bipolar CMOS (BiCMOS) and others. The substrate may also be a processor that includes row and column addressing communication at a periphery. As set forth herein, the substrate may also be an FR-type structure.

Upon the substrate, the inventive embodiment(s) may be arranged with contact of first and second electrodes at the periphery. After forming 810 the first electrode, the process flow may take an optional path of forming 812 a first protective film on the first electrode. In any event, the process flow continues by forming 820 a first thin adhesion promoter layer over the substrate and the first electrode. Thereafter, the process flow may continue by forming 830 an FEP structure.

This process flow may take various embodiments as set forth herein. In one embodiment, an L-B deposition 832 of a single-layer, crystalline FEP structure is carried out. Alternatively, a spin-on 834 deposition of a single FEP layer is carried out. In another alternative, an L-B deposition 836A of a first crystalline FEP layer is carried out, followed by forming 838 a spin-on FEP layer, and completed by an L-B deposition 836B of a second crystalline FEP layer.

After the formation of an FEP structure, the process flow may continue by forming 840 a second or upper TAP layer over the FEP structure. Thereafter, processing may continue by forming 850 a second or upper electrode, preferably by ALCVD processing according to known technique. Optional processing may occur by forming 852 a second or upper protective film in a cross-point pattern that will later be aligned with the second electrode. As set forth herein, the second protective film may be formed under ALCVD conditions that will not substantially compromise the integrity of the FEP structure.

Figure 9:
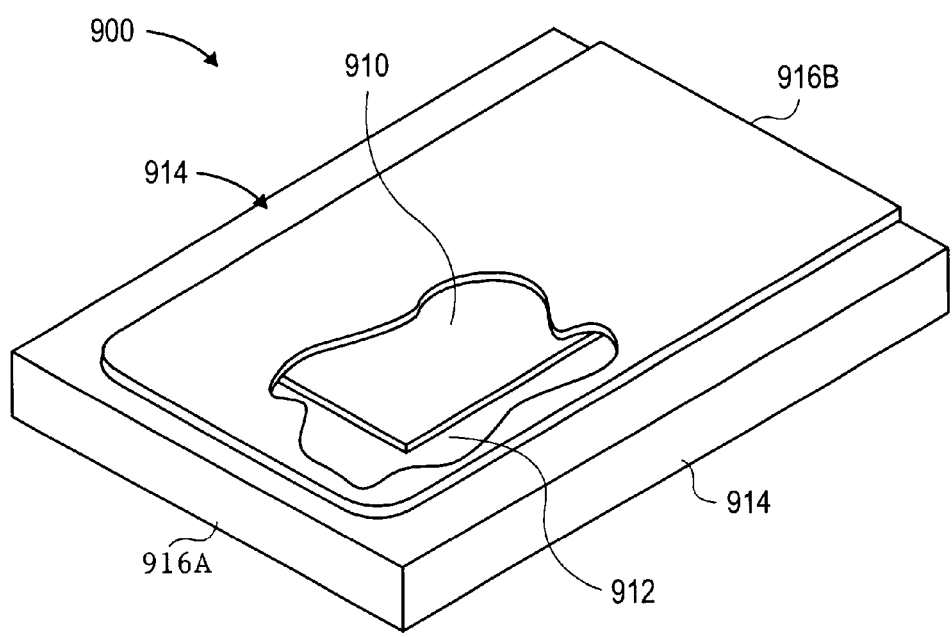
FIG. 9 is a perspective view of a system embodiment of the present invention.

One embodiment of the present invention is a memory system. FIG. 9 illustrates an perspective view of part of a memory system 800 that is inserted into a host (not pictured) according to an embodiment of the present invention. The memory system 800 besides the host (not pictured) may include a memory article 910 disposed upon a substrate 912 that may be microprocessor silicon or the like. Alternatively, substrate 912 may be a board such as a fiberglass-resin (FR) card or motherboard including a type referred to as FR4.

In FIG. 9, the substrate 912 is depicted as an FR board that may contain a chip set thereon. A physical interface 914 for a host is also depicted in FIG. 9. In one embodiment, physical interface 914 may be the lateral edges of a PCMCIA card as depicted in FIG. 9. In another embodiment the physical interface may be a dual in-line lead frame package that will disposed upon a motherboard, an expansion card, and application-specific integrated circuit (ASIC) board, or the like. A signal interface 916A, 916B is also depicted in FIG. 9. In this embodiment, signal interface 916A may be a female socket bank such as on a PCMCIA card that connects the memory article 910 to a host. Signal interface 916B could be a jack for a plug-in device such as a telephone or networking cable or the like. In this embodiment, signal interface 916B may be related to communications technology. Other embodiments of a signal interface 916B may include optical interfaces including wave guides and spatial transmitter/receiver devices such as an infrared (IR) port for communicating with a handheld device. Other embodiments of a signal interface 916B may include short-range radiant energy signals such as the technologies commonly referred to as Bluetooth (IEEE 8026).

The data storage portion of the inventive memory system 900 may include the memory article 910 that is disposed on the substrate 912. As set forth herein, the memory article 910 may comprise a first electrode disposed on a substrate, an FEP structure, a second electrode, and the thin adhesion promoter layers as set forth herein. Further, the memory article 910 may include first-and second crystalline FEP films as set forth herein as a surface-engineering solution to resist damage at the electrode-FEP interface. Other, more specific embodiments of the inventive memory system as set forth herein may be employed.

Various physical interfaces may be employed with memory system 900, depending upon the appropriate host. The memory system 900 may be employed with a physical interface that is configured to a host type such as a PCMCIA card interface, a personal data assistant (PDA) interface with or without wireless communication ability, or a hand-held host such as a cellular telephone. Another host type may be a mobile data storage interface that may include a compact flash card interface, a MEMORY STICK® interface made by Sony Corporation, a HIP ZIP® interface made by Iomega Corporation, a POCKET CONCERT® interface made by Intel Corporation, and others. Another host type may be a removable storage medium interface, a desktop personal computer expansion slot interface, and the like. In each instance, the appearance of the specific physical interface 914 will vary to take on the requisite receptacle, etc. of the host into which it is inserted or to which it is mounted. Similarly, the appearance of the specific signal interface 916A, 916B will vary to take on the requisite connector characteristics, etc. of the host.

For example, a PCMCIA card has a physical interface comprising at least the long edges of the card that frictionally and slidingly connect with the card bay. The signal interface for a PCMCIA card comprises at least the female multi-contact sockets at the back of the card, and the specific plug-in outlets at the front of the card.

Low operating voltages are preferred and achieved by embodiments of the present invention. According to an embodiment, switching voltage may be in the range from about 0.5 V to less than about 9 V. Conventional nonvolatile memory such as flash may require charge pump technology to achieve a sufficient voltage to write to the floating gate. However, the present invention presents a low-voltage technology for nonvolatile memory that may obviate the need for charge pump technology and other higher-voltage memory technologies.

The following is an example of a method of making an embodiment of the present invention. Reference may be made to FIGS. 1–6. First, a substrate 12 is provided, comprising logic-bearing silicon for an inventive cross-point polymer memory structure. Substrate 12 may include a dielectric material such as silicon oxide. In substrate 12, a recess 16 is etched and a collimated PVD aluminum first electrode 18 is formed within recess 16. PVD conditions are restricted only by the thermal budget of the process flow and need not be at as low a temperature a subsequent processing. Thereafter, a protective layer 24 of TiN is formed by PVD or CVD. Again, limited to thermal budget restrictions, PECVD may be substituted for the usually higher-temperature CVD of TiN.

After filling of recess 16 by PECVD of TiN to form a protective layer 24, a CMP process is carried out that reduces the Z-direction profile of the memory structure 10 and converts protective layer 24 to a damascene protective film 26. Thereafter, a first TAP layer 28 is formed by spin-on processing to a thickness in a range from about 50 Å to about 100 Å. Spin-on conditions include depositing the adhesion promoter as a fluid in a puddle prime onto substrate 12 for a period of from about 5 to 25 seconds and spinning substrate 12 and in a rotational range from about 300 rpm to about 6000 rpm and for a time range from about 5 seconds to about 20 seconds.

Under L-B deposition conditions, a single, crystalline FEP layer 30 is formed to a thickness from about 500 Å to about 2,000 Å, preferably about 1,000 Å. FEP layer 30 comprises a copolymer of $(CH_2-CF_2)_n-(CHF-CF_2)_m$ wherein n and m equal 1, and wherein n is about 0.75. Thereafter, a second TAP layer 34 is formed by spin-on processing as set forth in this example.

Thereafter, a mask (not depicted) is patterned in a cross-point configuration to first electrode 18, and a protective TiN layer of a thickness in the range from about 10 nm to about 100 nm is formed under PECVD conditions that operate at or below about 100° C. Thereafter, a second aluminum electrode is formed by PVD, also at operating conditions at or below about 150° C. in order to protect the FEP structure 32. According to this example, the cross-point matrix polymer memory structure operates in a range below about 9 V, and preferably in a range from about 0.5 V to about 5 V. This voltage may relate to both the destructive read method and the write method according to an embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A polymer memory device comprising:
   a first electrode disposed on a substrate;
   a first organic adhesion layer disposed over the substrate and over the first electrode;
   a ferroelectric polymer structure disposed above and on the first organic adhesion layer;
   a second organic adhesion layer disposed above and on the ferroelectric polymer structure; and
   a second electrode disposed over the second organic adhesion layer, wherein the ferroelectric polymer structure comprises:
      a first ferroelectric polymer layer disposed over the first organic adhesion layer;
      a second ferroelectic polymer layer disposed over the first ferroelectric polymer layer; and
      a third ferroelectric polymer layer disposed over the second ferroelectric polymer layer.

2. The polymer memory device according to claim 1, wherein layers between the electrodes further consist essentially of:
   the first organic adhesion layer;
   the ferroelectric polymer structure;
   the second organic adhesion layer; and
   an upper protective film disposed above and on the organic adhesion layer.

3. The polymer memory device according to claim 1, wherein the first and second organic adhesion layers have a thickness in a range from about 25 Å to about 200 Å.

4. The polymer memory device according to claim 1, wherein the first and second organic adhesion layers have a thickness in a range from about 30 Å to about 50 Å.

5. The polymer memory device according to claim 1, wherein the ferroelectric polymer structure further comprises:
   a single, crystalline ferroelectric polymer layer disposed over the substrate.

6. The polymer memory device according to claim 1, wherein the ferroelectric polymer structure further comprises:
   a spin-on ferroelectric polymer layer disposed over the substrate.

7. The polymer memory device according to claim 1, wherein the organic adhesion layers further comprise:
   a hexamethyldisilazane composition.

8. The polymer memory device according to claim 1, wherein the first and second organic adhesion layers exhibit a morphology characteristic of a spin-on formation process.

9. The polymer memory device according to claim 1, wherein the first and second organic adhesion layers exhibit a morphology characteristic of a Langmuir-Blodgett deposition process.

10. The polymer memory device according to claim 1, wherein the first organic adhesion layer exhibits a morphology characteristic of a spin-on formation process, and the second organic adhesion layer exhibits a morphology characteristic of a Langmuir-Blodgett deposition process.

11. A polymer memory device comprising:
    a first electrode disposed on a substrate;
    a first organic adhesion layer disposed over the substrate and over the first electrode;
    a ferroelectric polymer structure disposed above and on the first organic adhesion layer;
    a second organic adhesion layer disposed above and on the ferroelectric polymer structure;
    a second electrode disposed over the second organic adhesion layer;
    a first protective film disposed between the first electrode and the ferroelectric polymer structure; and
    a second protective film disposed between the ferroelectric polymer structure and the second electrode.

12. A cross-point matrix polymer memory structure comprising:
    a first aluminum or copper electrode disposed on a substrate;
    a first refractory metal nitride or oxide protective film disposed above and on the first electrode;
    a first organic adhesion layer disposed above and on the first refractory metal nitride or oxide protective film;
    a ferroelectric polymer structure disposed over the substrate and the first protective film;
    a second organic adhesion layer disposed above and on the ferroelectric polymer structure;
    a second refractory metal nitride or oxide protective film disposed over the ferroelectric polymer structure; and
    a second aluminum or copper electrode disposed above and on the second refractory metal nitride protective film.

13. The cross-point matrix polymer memory structure according to claim 12, wherein the organic adhesion layers comprise:
    a hexamethyldisilazane composition.

14. The cross-point matrix polymer memory structure according to claim 12, wherein the organic adhesion layers have a thickness in a range from about 25 Å to about 200 Å.

15. The cross-point matrix polymer memory structure according to claim 12:

wherein the organic adhesion layers further comprise a hexamethyldisilazane composition; and wherein the ferroelectric polymer structure further comprises a polymer selected from $(CH_2-CF_2)_n$, $(CHF-CF_2)_n$, $(CF_2-CF_2)_n$, α-, β-, γ-, and δ-phases thereof, $(CH_2-CF_2)_n-(CHF_2-CF_2)_m$ copolymer, α-, β-, γ-, and δ-phases of $(CH_2-CF_2)_n-(CH_2-CF_2)_m$ copolymer, and combinations thereof.

16. A memory system comprising:
a substrate disposed on a physical interface for a host;
a memory article disposed on the substrate, the memory article comprising:
  a first electrode disposed on a substrate;
  a first organic adhesion layer disposed over the first electrode;
  a ferroelectric polymer structure disposed over the first organic adhesion layer;
  a second organic adhesion layer disposed over the ferroelectric polymer structure; and
  a second electrode disposed above and on the second organic adhesion layer;
a signal interface for communication from the memory article to the host; and
a host, wherein the ferroelectric polymer structure comprises:
  a first ferroelectric polymer layer disposed over the first organic adhesion layer;
  a second ferroelectric polymer layer disposed over the first ferroelectric polymer layer; and
  a third ferroelectric polymer layer disposed over the second ferroelectric polymer layer.

17. The memory system according to claim 16, wherein the physical interface is configured to a host interface that is selected from a PCMCIA card interface, a compact flash card interface, a memory stick-type card interface, a desktop personal computer expansion slot interface, and a removable medium interface.

18. The memory system according to claim 16, wherein the organic adhesion layers further comprise:
a hexamethyldisilazane composition.

19. An apparatus, comprising:
a damascene structure, wherein the damascene structure includes a first electrode in a substrate and a first protective film over the first electrode; and
a first ferroelectric polymer layer over the damascene structure.

20. The apparatus of claim 19, further comprising:
a first adhesion layer over the damascene structure, wherein the first ferroelectric polymer layer is over the first adhesion layer;
a second adhesion layer over the first ferroelectric polymer layer;
a second electrode disposed over the second adhesion layer; and
a second protective film between the first ferroelectric polymer layer and the second electrode.

21. The apparatus of claim 19, further comprising:
a second ferroelectric polymer layer over the first adhesion layer; and
a third ferroelectric polymer layer over the first ferroelectric polymer layer.

22. The apparatus of claim 19, wherein the first protective film includes a titanium nitride (TIN) layer and wherein the first electrode comprises aluminum or copper.

* * * * *

UNITED STATES PATENT AND TRADEMARK OFFICE
CERTIFICATE OF CORRECTION

PATENT NO. : 6,798,003 B2
DATED : September 28, 2004
INVENTOR(S) : Li et al.

It is certified that error appears in the above-identified patent and that said Letters Patent is hereby corrected as shown below:

Column 11,
Line 67, delete "50Å" and insert -- 80Å --.

Column 13,
Line 6, delete "-($CHF_2$-" and insert -- (CHF --.
Line 7, delete "-($CH_2$-" and insert -- (CHF --.

Signed and Sealed this

Third Day of May, 2005

JON W. DUDAS
*Director of the United States Patent and Trademark Office*